(12) United States Patent
Montanini et al.

(10) Patent No.: US 7,635,896 B2
(45) Date of Patent: Dec. 22, 2009

(54) SOI DEVICE WITH CONTACT TRENCHES FORMED DURING EPITAXIAL GROWING

(75) Inventors: Pietro Montanini, Milan (IT); Giuseppe Ammendola, S. Giuseppe Vesuviano (IT); Riccardo Depetro, Domodossola (IT); Mottura Marta, Milan (IT)

(73) Assignee: STMicroelectronics S.r.l., Agrate Brianza (mi) (IT)

( * ) Notice: Subject to any disclaimer, the term of this patent is extended or adjusted under 35 U.S.C. 154(b) by 157 days.

(21) Appl. No.: 11/820,393

(22) Filed: Jun. 19, 2007

(65) Prior Publication Data

US 2007/0296036 A1 Dec. 27, 2007

(30) Foreign Application Priority Data

Jun. 27, 2006 (EP) .................................. 06116123

(51) Int. Cl.
*H01L 27/12* (2006.01)
(52) U.S. Cl. ............... 257/347; 257/350; 257/E21.345; 257/E21.538; 257/E21.703; 438/149
(58) Field of Classification Search ............... 257/347, 257/350, 501; 438/149
See application file for complete search history.

(56) References Cited

U.S. PATENT DOCUMENTS

| 4,948,748 | A | * | 8/1990 | Kitahara et al. | ............. 438/405 |
| 6,130,458 | A | * | 10/2000 | Takagi et al. | ................ 257/351 |

* cited by examiner

*Primary Examiner*—A. Sefer
(74) *Attorney, Agent, or Firm*—Lisa K. Jorgenson; William R. McClellan; Wolf, Greenfield & Sacks, P.C.

(57) ABSTRACT

A method for manufacturing an integrated electronic device. The method includes providing an SOI substrate having a semiconductor substrate, an insulating layer on the semiconductor substrate, and a semiconductor starting layer on the insulating layer; epitaxially growing the starting layer to obtain a semiconductor active layer on the insulating layer for integrating components of the device, and forming at least one contact trench extending from an exposed surface of the starting layer to the semiconductor substrate before the step of epitaxially growing the starting layer, wherein each contact trench clears a corresponding portion of the starting layer, of the insulating layer and of the semiconductor substrate, the epitaxial growing being further applied to the cleared portions thereby at least partially filling the at least one contact trench with semiconductor material.

7 Claims, 11 Drawing Sheets

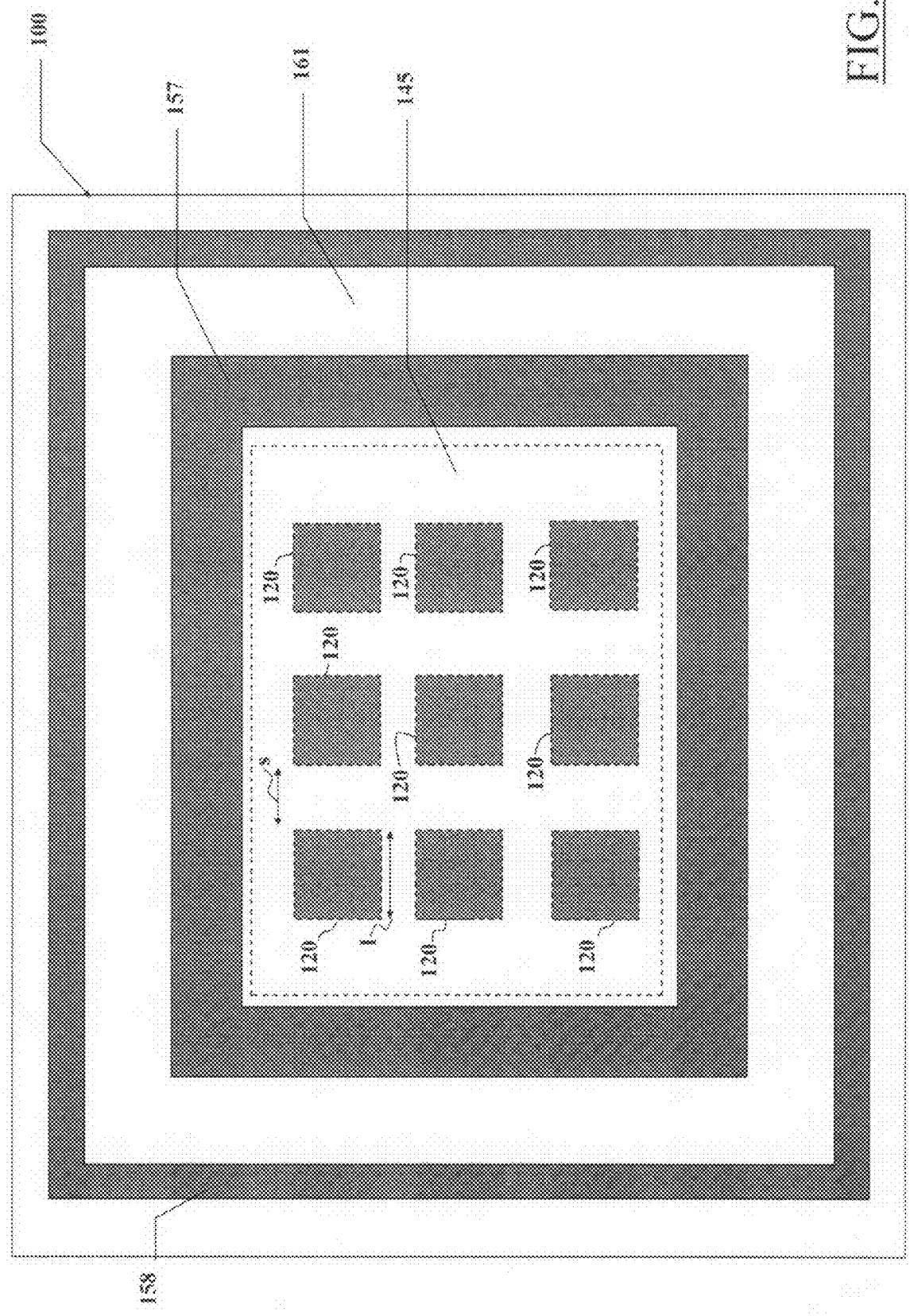

SOI DEVICE WITH CONTACT TRENCHES FORMED DURING EPITAXIAL GROWING

BACKGROUND OF THE INVENTION

1. Field of the Invention

The present invention relates to the electronics field. More specifically, the present invention relates to integrated electronic devices of the Silicon On Insulator (SOI) type.

2. Discussion of the Related Art

Electronic devices of the SOI type are integrated in a composite wafer, in which a buried insulating layer (such as of silicon oxide) separates two semiconductor layers (such as of mono-crystalline silicon). Particularly, the lower (thicker) silicon layer defines a common substrate; the upper (thinner) silicon layer acts as a starting layer, which is grown epitaxially to obtain an active layer housing the different electronic components (such as, MOSFET transistors) of the SOI device.

The oxide layer provides a robust voltage insulation of the components in the active layer from the substrate. Moreover, DTI (Deep Trench Isolation) processes may be efficiently employed to provide lateral insulation from adjacent components that are integrated in the same SOI device within different insulated regions of the active layer. In particular, such regions are fully insulated by means of the (buried) insulating layer and the DTI trenches. In addition, standard LOCOS (Local Oxidation of Silicon) or STI (Shallow Trench Isolation) processes may be used to provide a further lateral insulation of the components that are integrated in the same insulated region. Moreover, the SOI devices have other important advantages. For example, they do not suffer leakage effects between adjacent components. Moreover, the parasitic capacitances of the components integrated in the SOI device are significantly reduced.

Usually it is desired to maintain the substrate at a predetermined voltage (for example, to avoid undesired capacitive coupling effects). Particularly, when the substrate is not directly accessible from the backside of the SOI device it needs to be biased to the desired voltage through a corresponding contact formed on a front (upper) surface defined by the active layer. A typical example is an SOI device that is mounted on a chip carrier with a flip-chip technique, wherein the front surface of the SOI device faces the chip carrier (with its contacts that are directly connected to corresponding bumps of the chip carrier).

For this purpose, a via hole (or simply via) crossing the insulating layer of the SOI wafer is provided so as to connect the two silicon layers (i.e., the active layer and the substrate). Typically, the via is formed in a dedicated insulated region of the active layer and is connected to a corresponding contact arranged on the front surface.

In the state of the art such via is obtained by selectively etching the active layer so forming a trench extending from the front surface down to the substrate. The walls of the trench are then covered by a conformal conductive layer (i.e., such as to substantially follow the profile of the underlying structure), which conductive layer further extends on the front surface so as to define the desired contact.

A drawback of the solution described above is that each trench consumes a significant area of the SOI device. In fact, the trench must be wide enough to ensure that the conductive layer uniformly covers all its walls so resulting conformal (i.e., the trench has a significant so-called "step coverage"). This significantly increases the size of the whole SOI device.

A further problem of the SOI wafer is that the active layer can be affected by impurities, which impair the performance of the electronic components that are housed therein (and then of the whole SOI device).

In addition, the SOI wafer is typically used to integrate high-voltage electronic components (e.g., able to sustain voltages ranging from 50V to 250V); however, the same structure is not well suited to house low-voltage electronic components (e.g., able to sustain voltages ranging from 1.8V to 3.3V), for which a standard wafer with PN-junction insulation would be preferred. This problem is particularly acute for devices requiring both low-voltage and high-voltage electronic components.

SUMMARY OF THE INVENTION

In principle, the present invention is based on idea of providing one or more contact trenches across the insulating layer.

One embodiment of the present invention proposes a method for manufacturing an integrated electronic device. The method starts with the step of providing an SOI substrate; the SOI substrate comprises a semiconductor substrate, an insulating layer on the semiconductor substrate, and a semiconductor starting layer on the insulating layer. The starting layer is then epitaxially grown to obtain a semiconductor active layer on the insulating layer (for integrating components of the device). The method further comprises forming one or more contact trenches extending from an exposed surface of the starting layer to the semiconductor substrate before epitaxially growing the starting layer; each contact trench clears a corresponding portion of the starting layer, of the insulating layer and of the semiconductor substrate. The epitaxial growing is then further applied to the cleared portions, thereby at least partially filling the contact trenches with semiconductor material.

According to one embodiment of the invention, an implantation process is used to form an interface region enclosing the contact trenches.

Advantageously, this result is achieved by means of one or more beams of impurities, which are tilted with respect to an axis of each contact trench.

In one embodiment of the invention, the proposed solution is used to form a front-rear contact across the insulating layer. In this case, the interface region is a contact region (of the same type of conductivity as the semiconductor substrate and the active layer, but with a higher concentration of impurities); a further contact region extends from a front surface of the device (wherein a corresponding electrical contact is formed) to a (buried) contact region.

As a further enhancement, a contact window on the front surface (for the electrical contact) is spaced apart from an axis of each contact trench.

A preferred quantitative definition of this displacement is also proposed.

In another embodiment of the invention, the interface region getters impurities of the active layer (which impurities are then segregated by insulating a gettering region including it).

Advantageously, in both cases multiple contact trenches are formed.

A preferred layout of those contact trenches is also proposed.

In another embodiment of the invention, the devised solution is used to create a selective SOI device. In this case, the interface region is an insulating region (of the opposite type of conductivity with respect to the active layer); an insulating trench enclosing it defines an active region based on PN-injunction insulation (such as for integrating low-voltage components or components that have to dissipate heat through the semiconductor substrate), whereas the remaining portion of the active layer maintains the SOI structure (such as for integrating high-voltage components or components that need fast access time, low leakage and low parasitic capacitance).

Another aspect of the present invention provides a corresponding electronic device.

BRIEF DESCRIPTION OF THE DRAWINGS

The present invention, as well as further features and the advantages thereof, will be best understood by reference to the following detailed description, given purely by way of a non-restrictive indication, to be read in conjunction with the accompanying drawings. In this respect, it is expressly intended that the figures are not necessary drawn to scale and that, unless otherwise indicated, they are merely intended to conceptually illustrate the structures and procedures described herein. Particularly:

FIG. 2 shows a partially cut-away elevation view of this electronic device;

DETAILED DESCRIPTION

Referring to FIGS. 1A through 1I, a process is described for manufacturing an electronic device 100 (see FIG. 1I) with a front-rear contact according to a first embodiment of the present invention.

Figure 1A:
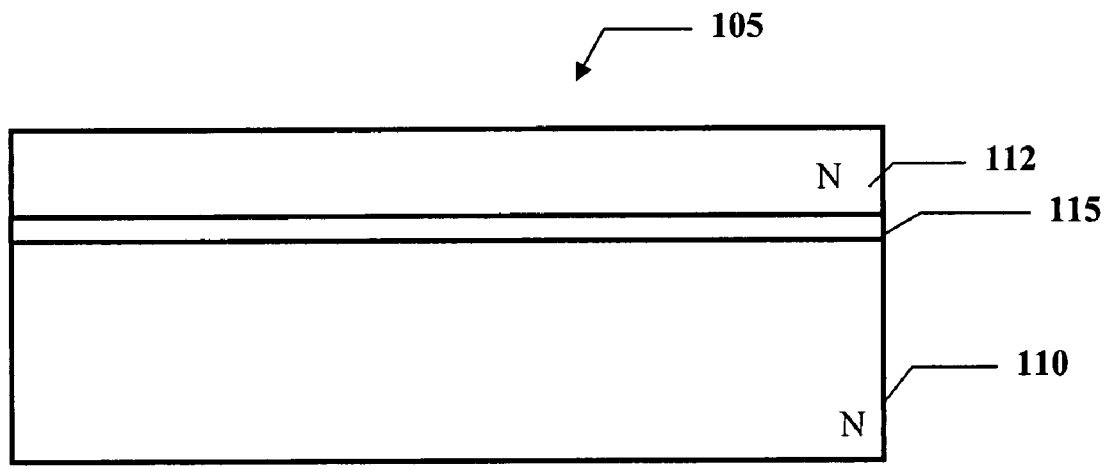
FIGS. 1A through 1I are cross-section views illustrating the main phases of the manufacturing process of an electronic device, according to a first embodiment of the present invention.

Considering in particular FIG. 1A, the starting material is an SOI substrate 105. The SOI substrate includes a semiconductor substrate 110 (for example, of the N-type of conductivity with a resistivity ranging from 1Ω cm to 50Ω cm, such as 40Ω cm). Moreover, the SOI substrate 105 includes a semiconductor starting layer 112 of the N-type, which is separated from the (semiconductor) substrate 110 by an insulating layer 115. For example, the insulating layer 115 has a thickness ranging from 0.1 μm to 2 μm, and preferably from 0.5 μm to 1.5 μm (such as, 1 μm), whereas the starting layer 112 has a thickness ranging from 50 nm to 1500 nm.

Figure 1B:
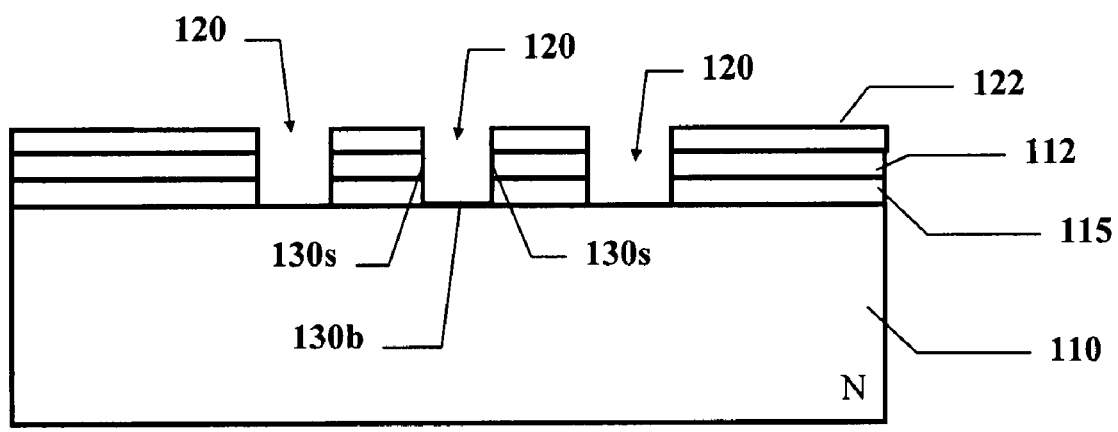

Moving now to FIG. 1B, one or more contact trenches 120 (such as a matrix of 9 contact trenches 120, three of which shown in the figure) are formed by selectively etching the layers 112 and 115. For this purpose, a photoresist mask 122 is provided on top of the starting layer 112, so as to leave exposed areas thereof where the contact trenches 120 are desired. Using suitable etching techniques, the layers 112, 115 are selectively removed, down to the substrate 110.

The etching of the layers 112, 115 is performed by two processes, which are substantially anisotropic along a vertical direction Y—perpendicular to the layers 112, 115 (meaning that the layers 112, 115 are etched only vertically). The first etching process selectively removes the areas of the starting layer 112 which are left exposed by the photoresist mask 122. Then, the second etching process selectively removes the insulating layer 115 in the same areas down to the substrate 110.

In such a way, each contact trench 120 clears a corresponding upper portion of the substrate 110 (defining a bottom wall 130b) and corresponding internal portions of the starting layer 112 and of the insulating layer 115 (defining side walls 130s).

Figure 1C:
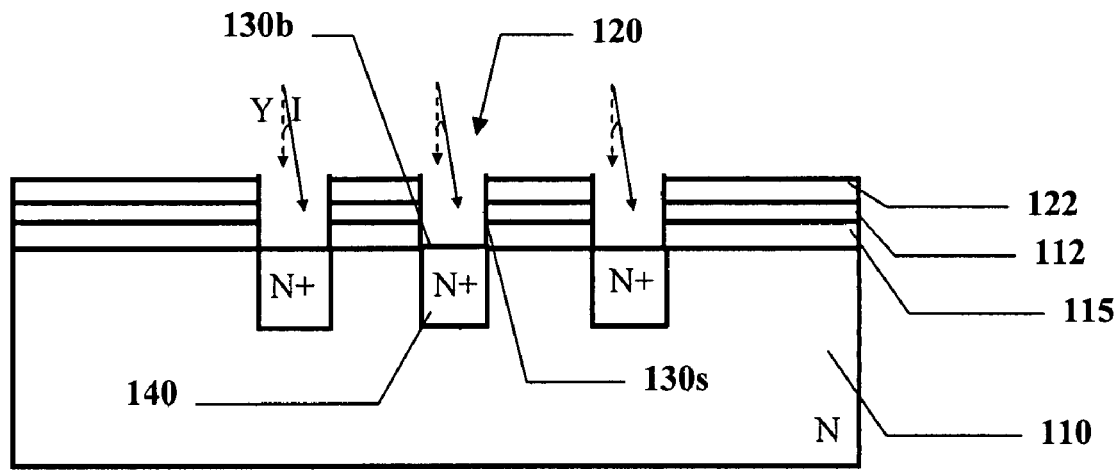

As shown in FIG. 1C, a dopant implantation is performed in order to form heavily doped internal regions 140 within the substrate 110 and the starting layer 112 (only shown for the substrate 110 in the figure). For example, in order to form N+ internal regions 140, Arsenic (As), Antimony (Sb) or Phosphorus (P) dopant ions are used; preferably, the dopant dose ranges from $10^{12}$ ions/cm$^2$ to $10^{16}$ ions/cm$^2$. Such implantation is performed with the photoresist mask 122 still in place, so as to have the internal regions 140 in zones corresponding to the contact trenches 120.

For this purpose, two (or more) dopant implantation processes are performed along different directions, in order to cause desired dopant ions to penetrate the sidewalls 130s of the starting layer 112 and the bottom walls 130b of the substrate 110. Particularly, each implantation process involves the use of a beam of dopant ions propagating along a direction I having a corresponding tilt α with respect to the vertical direction Y. Preferably, the tilt α ranges from 2° to 45°, and more preferably from 5° to 20° (such as α=7°). Preferably, two implantation processes are performed along directions that are symmetric with respect to the vertical direction Y (so as to reach opposed regions). For example, during a first implantation process the wafer is inclined with respect to the direction of the dopant ions beam at an angle α=7°, whereas during a second implantation process the wafer is inclined at the opposite angle α=−7°.

Figure 1D:
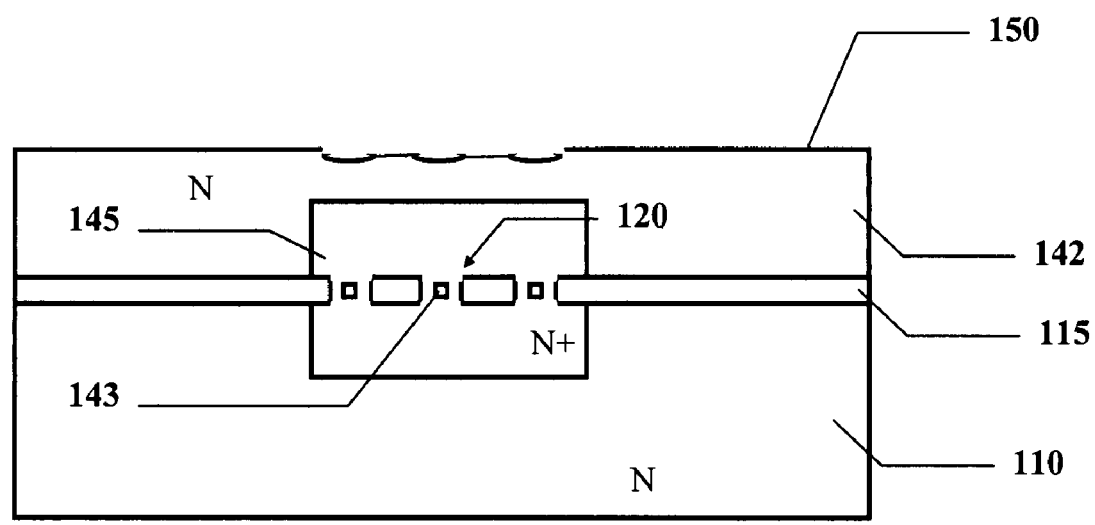

The photoresist mask 122 is stripped at the end of the implantation processes. Referring now to FIG. 1D, an epitaxial growing process is then carried out (for example, by means of Vapor-Phase Epitaxy). The epitaxial growing process is performed in a room comprising a silicon compound (for example, silicon tetrachloride SiCl$_4$ or trichlorosilane SiHCl$_3$) at high temperature (for example, ranging from 1000° C. to 1200° C.). The epitaxial growing process applied to the starting layer 112 (shown in FIG. 1C) results in the generation of an active layer 142 of the N-type (for example, with a thickness of about 1 μm-10 μm).

Concurrently, the same epitaxial growing process applied to the walls 130b and 130s (again shown in FIG. 1C) at least partially fills the contact trenches 120, possibly leaving vacant regions 143 therein. This effect is due both to the geometry of the contact trenches 120 and to the different growing rates of the epitaxial growing process over the cleared portions of the substrate 110, of the insulating layer 115 and of the starting layer 112 (shown in FIG. 1C). As a result, the obtained structure may be not planar, with recesses corresponding to the contact trenches 120 on its front (upper) surface 150. In order to reduce this non-planarity (which may lead to an electrical discontinuity of the final structure), the layout of the contact trenches 120 is finely tuned taking into account the epitaxial growing process parameters (as described in detail in the following).

During the epitaxial growing process, the dopant ions of the internal regions 140 (shown in FIG. 1C) diffuse thereby forming a contact region 145 of the N+ type. As can be noted, the contact region 145 encloses all the contact trenches 120 (across the insulating layer 115) so as to electrically couple the substrate 110 with the active layer 142. The contact region 145 is more conductive than the semiconductor material surrounding it, due to the high dopant concentration created by the above-mentioned diffusion.

Figure 1E:
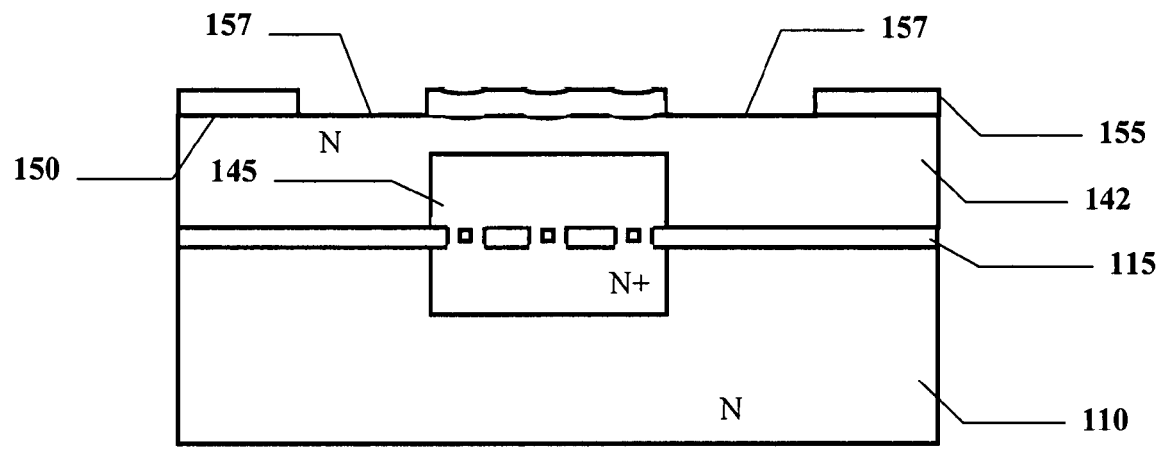

Moving to FIG. 1E, a field oxide layer 155 is formed (for example, by means of a selective or LOCOS thermal growth) in order to cover the front surface 150 of the active layer 142—except for a portion thereof where active areas 157 of the desired front-rear contact will be defined. For this purpose, a silicon nitride (such as $Si_3N_4$) mask—not shown in the figure—is provided on top of the active layer 142, so as to leave exposed areas thereof where the field oxide layer 155 is to be grown.

Figure 1F:
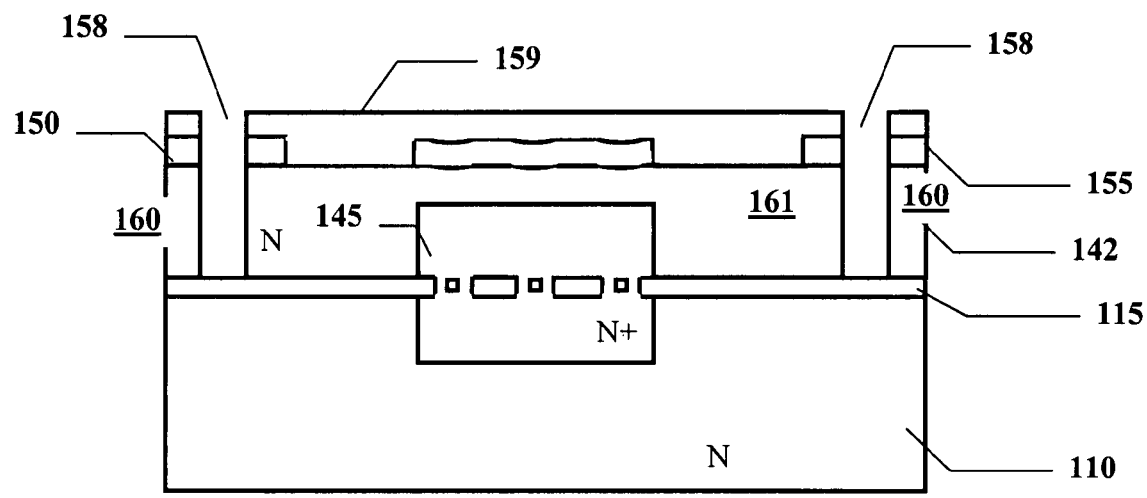
Figure 1G:
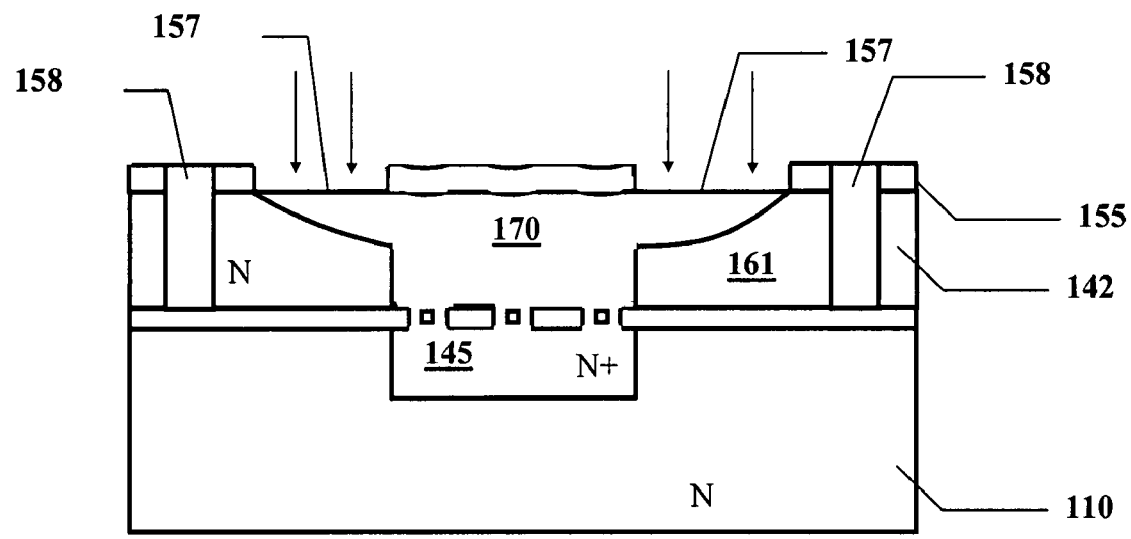

Continuing to FIG. 1F, one or more insulating trenches 158—for example, of the DTI type—are then formed. For this purpose, another photoresist mask 159 is provided on top of the field oxide layer 155 and of the active layer 142, so as to leave exposed areas thereof where the insulating trenches 158 are desired. Using suitable etching techniques, the active layer 142 and the field oxide layer 155 are selectively removed, down to the insulating layer 115. As a result, the insulating trenches 158 partition the active layer 142 into insulated regions 160, which will be used to integrate the desired electronic components. Moreover, the insulating trench 158 around the contact trenches 120 defines an (insulated) active region 161, which is used to contact the substrate 110 from the front surface 150 so as to provide the desired front-rear contact through the insulating layer 115.

For this purpose, the mask 159 is stripped away. Continuing to FIG. 1G, the insulating trench 158 is filled with dielectric material, such as silicon-dioxide (for example, by means of CVD oxide deposition). Thereafter, an implantation process is performed (through the active areas 157) in order to obtain a heavily doped region within the active region 161; in the example at issue, As or P dopant ions are used. Then, the dopant ions diffuse so forming an N+ contact region 170, which extends from the front surface 150 to the (buried) contact region 145.

Figure 1H:
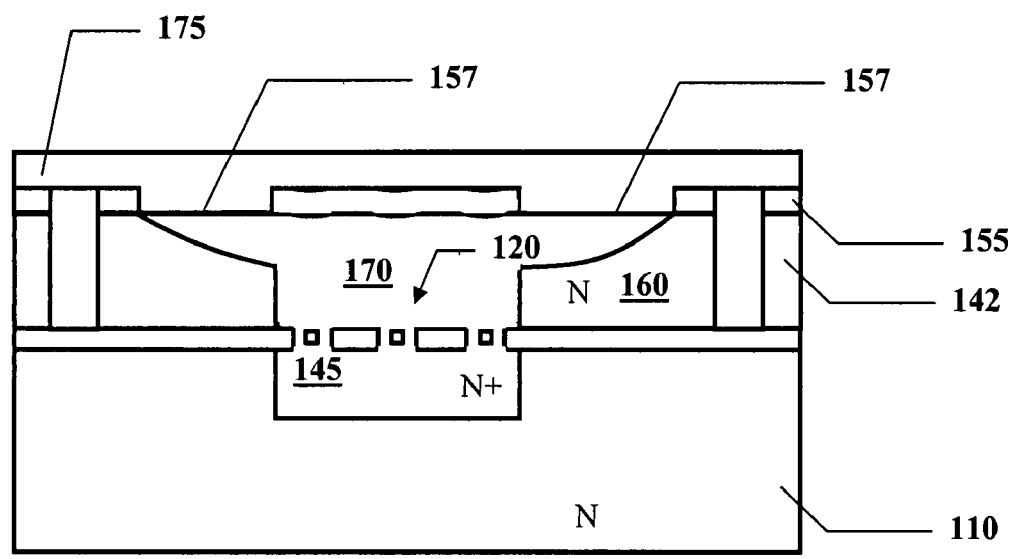

Moving to FIG. 1H, a dielectric layer 175 (for example, doped silicon oxide) is deposited on top of the field oxide layer 155 and on the active areas 157, for example, by means of a CVD process. Then, the dielectric layer 175 is planarized, typically using the CMP (Chemical Mechanical Polishing) technique, so as to flush the recesses corresponding to the contact trenches 120 formed beforehand.

Figure 1I:
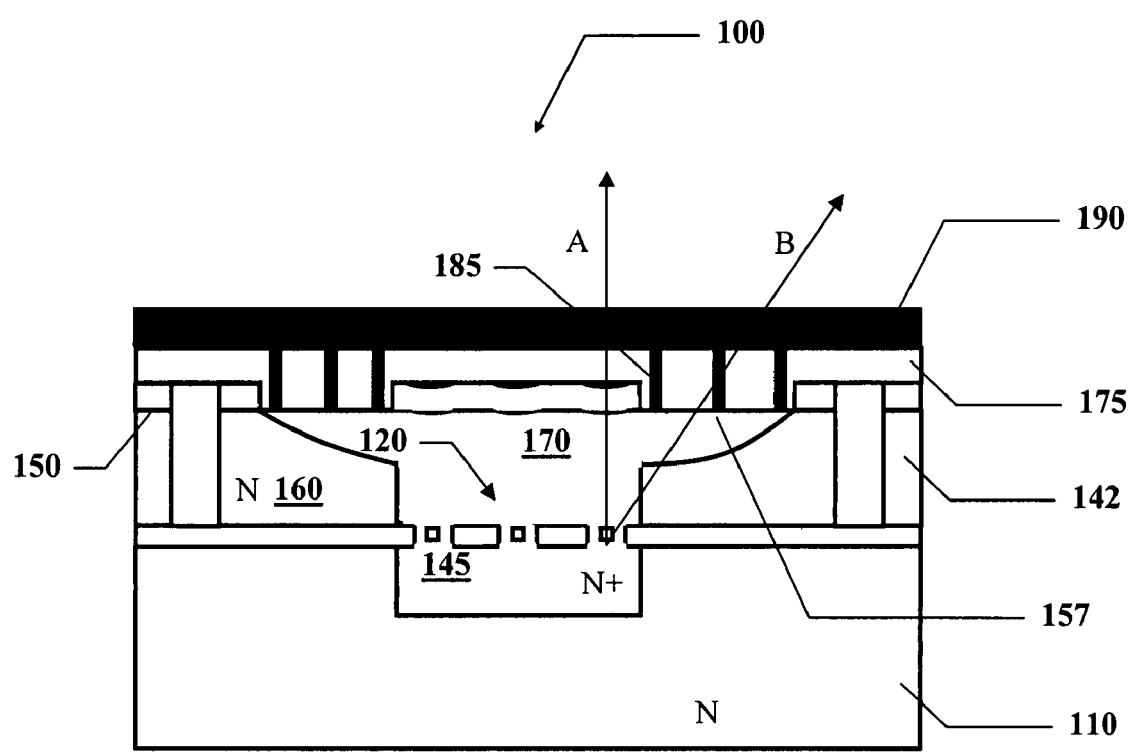

As shown in FIG. 1I, a plurality of contact windows 185 are etched in the dielectric layer 175 in correspondence of the active areas 157 (so as to reach the contact region 170). Preferably, each contact window 185 surrounds the contact region 145 in plan view. Particularly, each point of the contact window 185 is spaced apart from an axis A of each contact trench 120 (parallel to the vertical direction) in order to prevent any disturbances due to the corresponding recesses on the front surface 150. Preferably, a line B connecting each point of the contact window 185 (at the corresponding active area 157 on the front surface 150) with the edge of the contact trench 120 closest to the contact window 185 (on its bottom wall at an upper surface of the substrate 110) forms an angle β, which is higher than 60°, preferably at least equal to 61°-85°, and more preferably at least equal to 64°-82° (such as at least equal to 65°). In other words, this condition needs to be satisfied by the internal edge of the contact window 185, with respect to the contact trench 120 that is closest to the contact window 185 (being the same angle higher otherwise).

Afterwards, a metallization layer 190 (for example, Al or Ti/TiN plus a W-plug and an Al layer) is deposited on top of the wafer, thereby filling the contact windows 185 and covering the exposed surface of the dielectric layer 175. The metallization layer 190 is then shaped to define a pad. In such a way, the desired electronic device 100 is obtained; the electronic device 100 includes the required front-rear contact, which allows contacting the substrate 110 from the front surface 150 (for example, to bias the substrate 110 at a predetermined voltage in flip-chip applications). More specifically, this front-rear contact is obtained through the pad 190, the contact windows 185 (the higher the number of contact windows 185, the higher the conductivity thereof, the contact region 170, and the contact region 145.

The front-rear contact described-above has a small size (compared to the solutions known in the art); this has a beneficial effect on the amount of area taken up by the whole electronic device 100. Moreover, this result is achieved without adversely affecting the electrical properties of the front-rear contact, especially its resistance.

Particularly, several factors contribute to the desired characteristics of the front-rear contact. For example, a contribution is given by the contact region 145; particularly, its beneficial effect is emphasized by the fact that the contact region 145 surrounds the contact trenches 120. This is achieved thanks to the corresponding implantation processes that are tilted as indicated above (with the best result provided by the proposed angles).

In addition, the choice of displacing the contact windows 185 with respect to the axis of the contact trenches 120 creates a preferential path for the electrical charge along which the resistance of the semiconductor material is further reduced (with the best results that are provided by the proposed angles).

Moving to FIG. 2, a partially cut-away elevation view of the above-described electronic device 100 is shown. As can be noted, the insulating trench 158 defines the active region 161 for the front-rear contact. The active area 157 for the contact windows within the active region 161 surrounds the contact region 145 around the contact trenches 120.

Preferably, each contact trench 120 has a square transversal section with each side (denoted with l) ranging from 1.5 μm to 5 μm, and more preferably from 2 μm to 4 μm (such as 3 μm). The contact trenches 120 are arranged in a matrix (with three rows and three columns in the example at issue). Particularly, each contact trench 120 is spaced apart from any adjacent contact trench 120 by a distance (denoted with s), which preferably ranges from 1 μm to 3 μm, and more preferably from 1.2 μm to 2.5 μm (such as 1.5 μm).

The proposed layout of the contact trenches 120 allows reducing the above-mentioned electrical discontinuities of the electronic device 100 (due to the non-planarity caused by the contact trenches 120). Moreover, this arrangement of the contact trenches 120 has been found to provide optimum results (in terms of the lowering of the front-rear contact resistance).

The above-mentioned advantages of the proposed solution are confirmed by experiment results.

Figure 3:
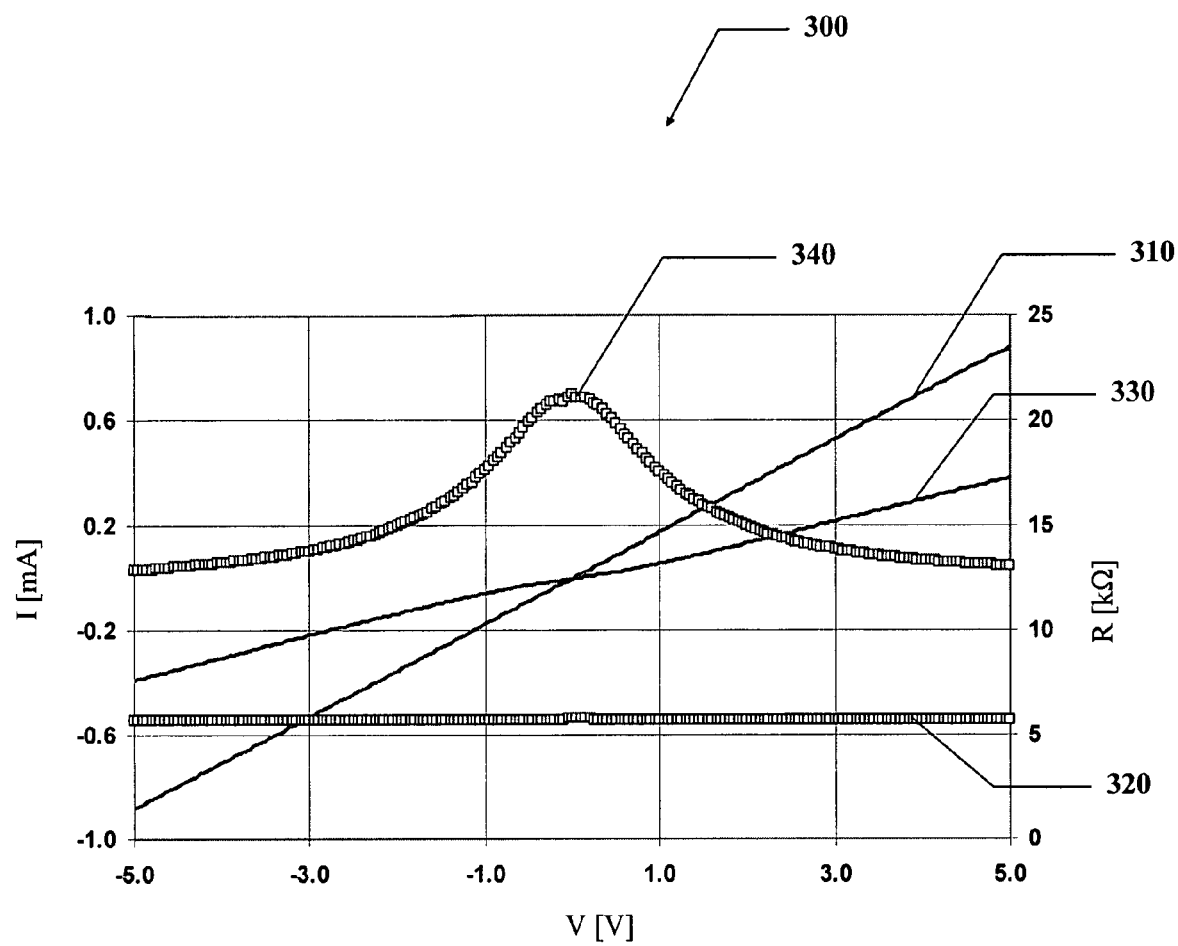
FIG. 3 shows an exemplificative diagram relating to electrical operative parameters of the same electronic device.

Particularly referring to FIG. 3, a diagram 300 shows a set of working characteristics of the front-rear contact according to an embodiment of the present invention (depending on the dopant concentration of the semiconductor material surrounding the contact trenches across the insulating layer). In particular, the diagram 300 has a current I[mA] on a left axis of ordinates, a resistance R[kΩ] on a right axis of ordinates and a biasing voltage V[V] on an axis of abscissas.

For this purpose, two adjacent front-rear contacts are formed in the same electronic device (both of them connected to its substrate). Biasing voltages V ranging from −5V to 5V are then applied between the two front-rear contacts, and the corresponding currents I are measured (with the resistance R that is calculated accordingly).

As can be seen, working characteristics 310 (representing the current) and 320 (representing the resistance) are obtained when the front-rear contacts are manufactured as described above. The remaining working characteristics 330 (representing the current) and 340 (representing the resistance) are obtained for non-optimized electronic devices without the (more doped) contact region surrounding the contact trenches (i.e., when the manufacturing process of the electronic device does not provide the implantation processes after the etching of the contact trenches).

As it can be noted, the working characteristic 320 is below the working characteristic 340 (meaning that the resistance R of the front-rear contact is lower). For example, when the biasing voltage V is equal to 2V the resistance R is reduced by about one third (from 15 kΩ to 6 kΩ).

Figure 4A:
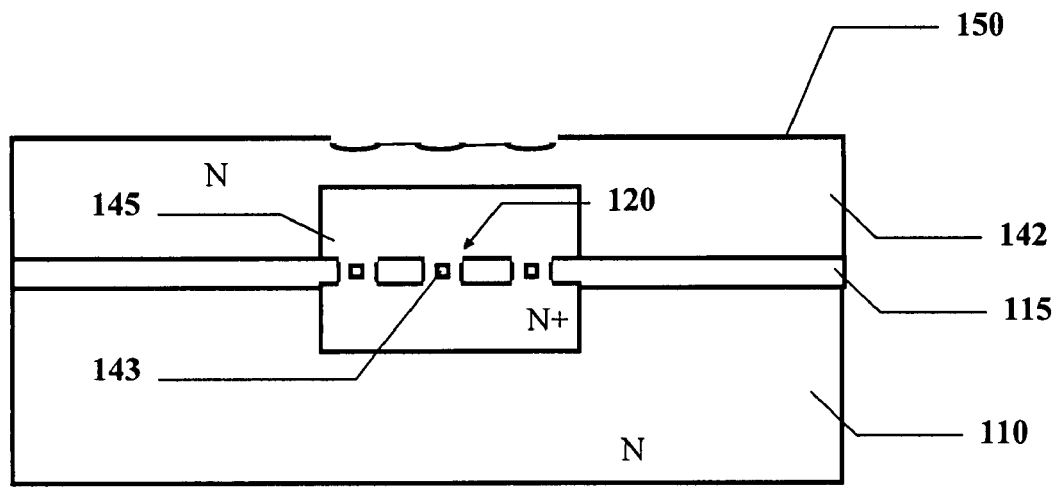
FIGS. 4A through 4B are cross-section views illustrating the main phases of the manufacturing process of an electronic device, according to a second embodiment of the present invention.
Figure 4B:
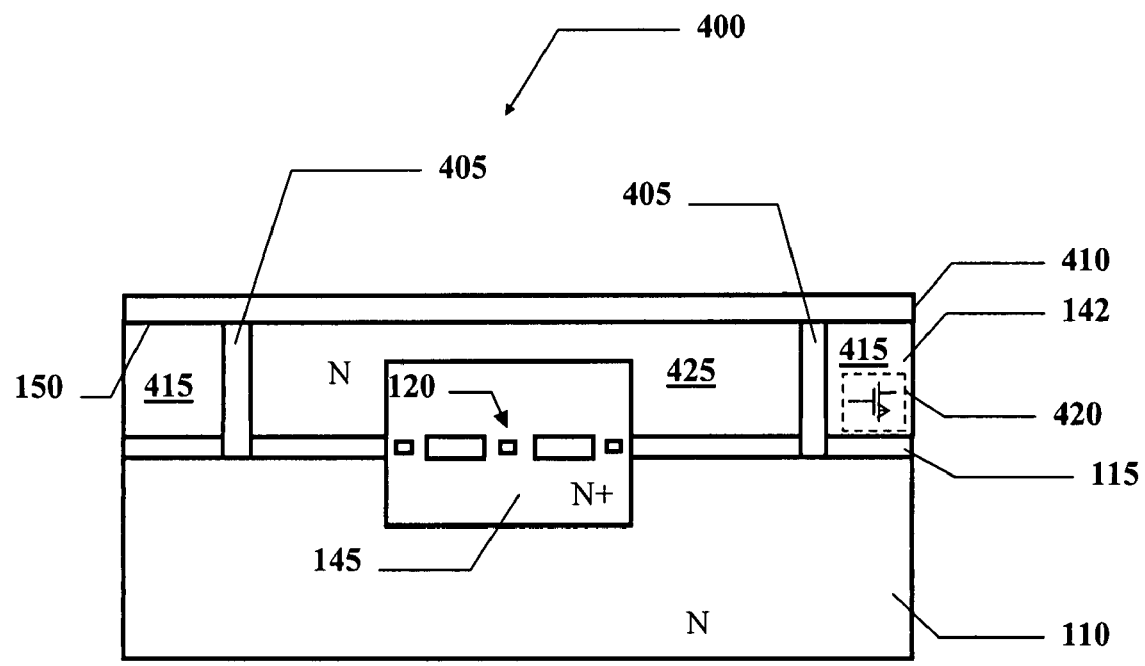

With reference now to FIGS. 4A through 4B, a process is described for manufacturing an electronic device 400 (see FIG. 4B) adapted for gettering of impurities according to a second embodiment of the present invention.

Considering in particular FIG. 4A, the same process steps described above are repeated until the creation of the contact region 145 (the elements corresponding to the ones of the preceding figures are denoted with the same references, and their explanation will be omitted for the sake of simplicity). The contact region acts as a gettering zone for any impurities of the whole active layer 142.

Moving now to FIG. 4B, one or more insulating trenches 405 are formed as described above (so as to reach the insulating layer 115). The insulating trenches 405 are likewise filled with dielectric material, and the whole front surface 150 is covered with a field oxide layer 410 suitably planarized (so as to obtain the desired electronic device 400). As can be seen, in this case the field oxide layer 410 covers the whole front surface 150 (without any contact windows); moreover, no additional contact region is formed (from the front surface 150 to the contact region 145).

The insulating trenches 405 again partition the active layer 142 into multiple active regions 415, which will be used to integrate the desired electronic components (schematically represented in the figure as 420). Moreover, the insulating trench 405 around the contact trenches 120 defines an (insulated) gettering region 425, which segregates the impurities—gettered by the contact region 145 beforehand.

In this way, a significant amount of impurities of the active layer 142 is removed from the active regions 415 (intended to house the electronic components 420). This strongly improves the performance of the electronic components 420, and then of the whole electronic device 400.

With reference now to FIGS. 5A through 5F, a process is described for manufacturing an electronic device 500 (see FIG. 5F) of the selective SOI type.

Figure 5A:
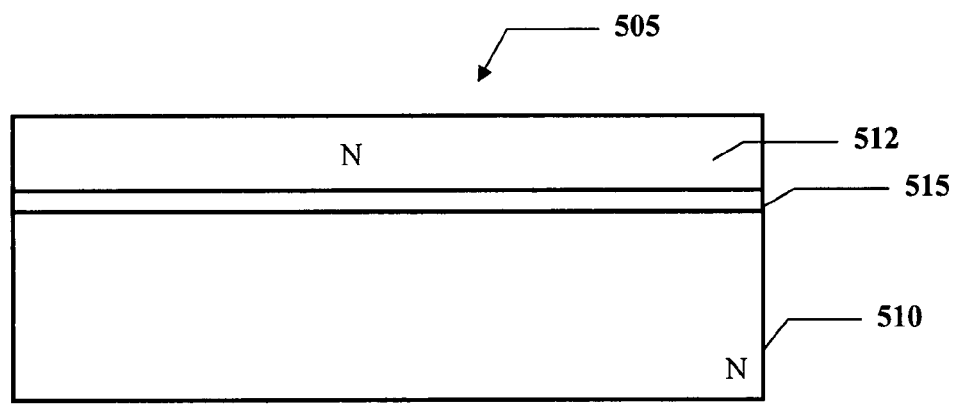
FIGS. 5A through 5F are cross-section views illustrating the main phases of the manufacturing process of an electronic device, according to a third embodiment of the present invention.

Considering in particular FIG. 5A, the starting material is again an SOI substrate 505 (with a semiconductor substrate 510, a semiconductor starting layer 512, and an insulating layer 515). However, in this case the insulating layer 515 has a thickness lower than 0.5 μm, and preferably ranging from 0.2 μm to 0.4 μm (such as 0.3 μm); likewise, the semiconductor starting layer 512 has a thickness lower than 0.5 μm, and preferably ranging from 0.1 μm to 0.45 μm (such as 0.3 μm).

Figure 5B:
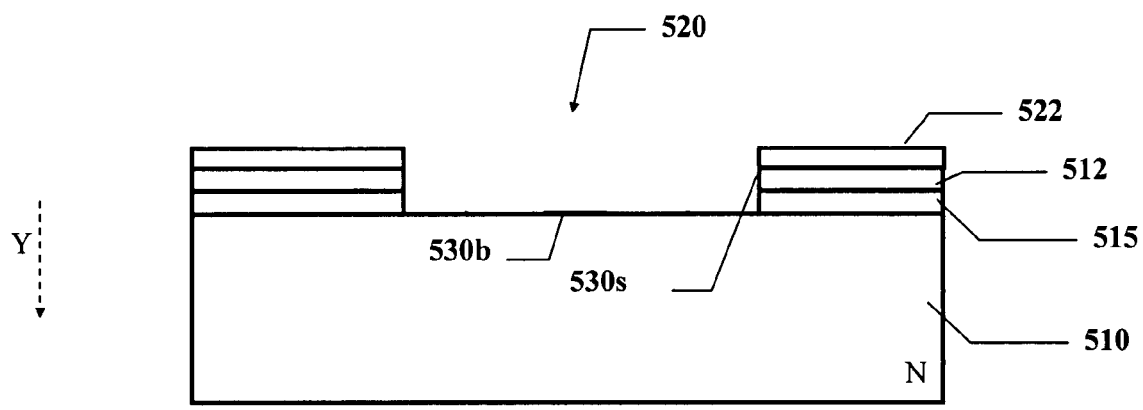

Moving now to FIG. 5B, a single contact trench 520 is formed as above through the layers 512, 515 (by means of two substantially anisotropic etching processes—along a vertical direction Y—through a corresponding photoresist mask 522); the contact trench 520 likewise clears a corresponding front portion of the substrate 510 (defining a bottom wall 530$b$) and corresponding internal portions of the starting layer 512 and of the insulating layer 515 (defining side walls 530$s$). In this case, the contact trench 520 has preferably a square shape, with each side higher than 400 μm.

Figure 5C:
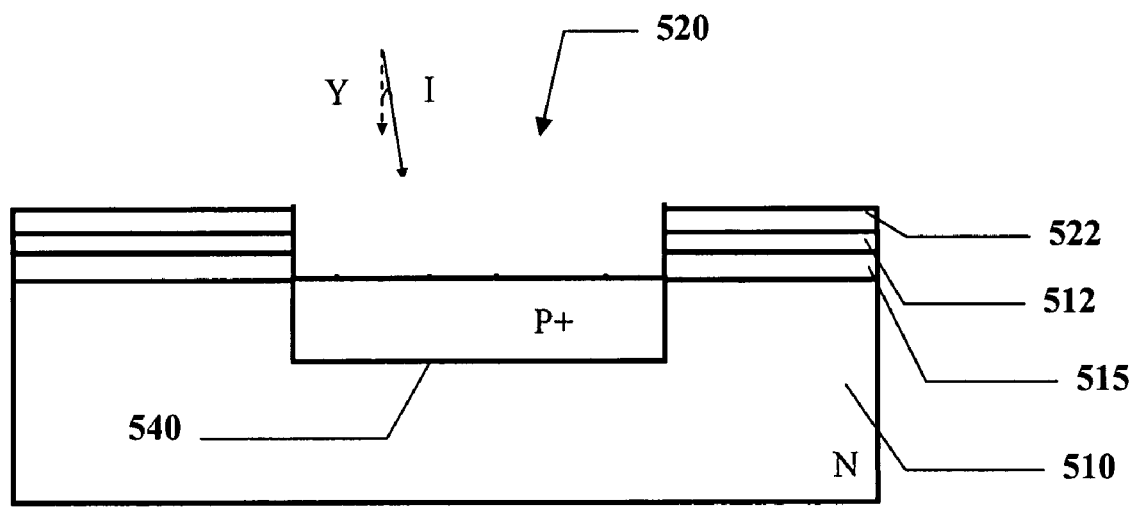

As shown in FIG. 5C, two (or more) dopant implantation processes are again performed (along directions I titled as above with respect to the vertical direction Y), in order to form heavily doped internal regions 540 within the substrate 510 and the starting layer 512 (only shown for the substrate 510 in the figure). However, in this case the internal region 540 is of the opposite type of conductivity with respect to the substrate 510 and the starting layer 512 (i.e., of the P-type). For example, Boron (B) dopant ions are used; preferably, the dopant dose ranges from $10^{12}$ ions/cm$^2$ to $10^{16}$ ions/cm$^2$.

Figure 5D:
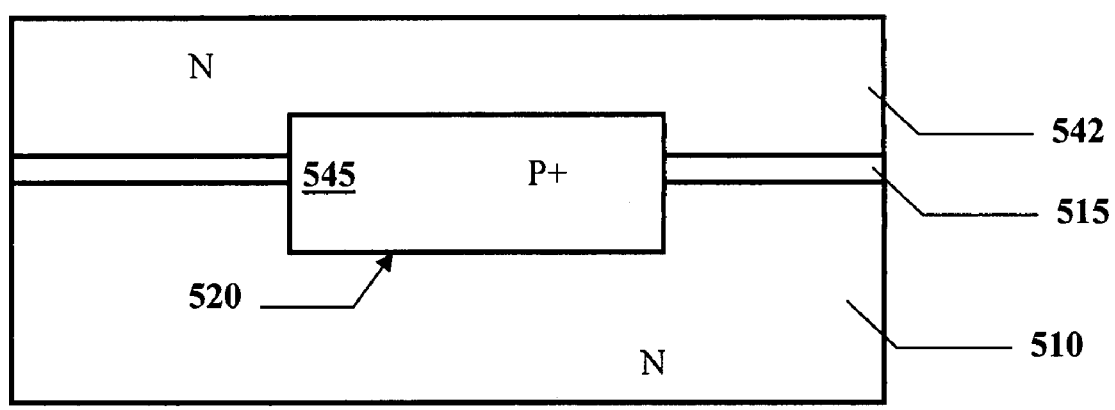

The photoresist mask 522 is likewise stripped at the end of the implantation processes. Referring now to FIG. 5D, a similar epitaxial growing process is carried out so as to form an active layer 542 of the N-type again; at the same time, the epitaxial growing process completely fills the contact trench 520 (without leaving any vacant regions).

During the epitaxial growing process, the dopant ions of the internal region 540 (shown in the FIG. 5C) diffuse thereby forming an insulating region 545 of the P+ type. As can be noted, the insulating region 545 encloses the contact trench 520 (across the insulating layer 515) so as to define a PN junction with the substrate 510 and another PN junction with the active layer 542.

Figure 5E:
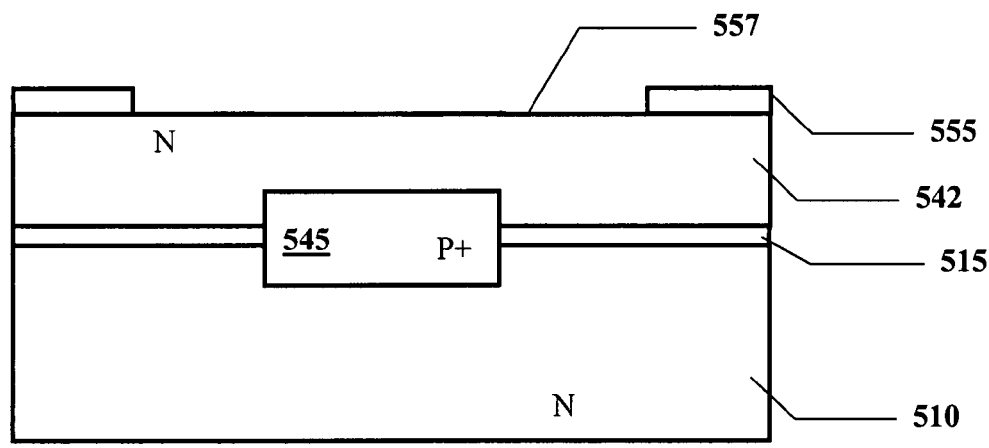

Moving to FIG. 5E, a field oxide layer 555 is again formed on top of the active layer 542—except for a portion thereof where a (larger) active area 557 around the insulating region 545 is desired.

Figure 5F:
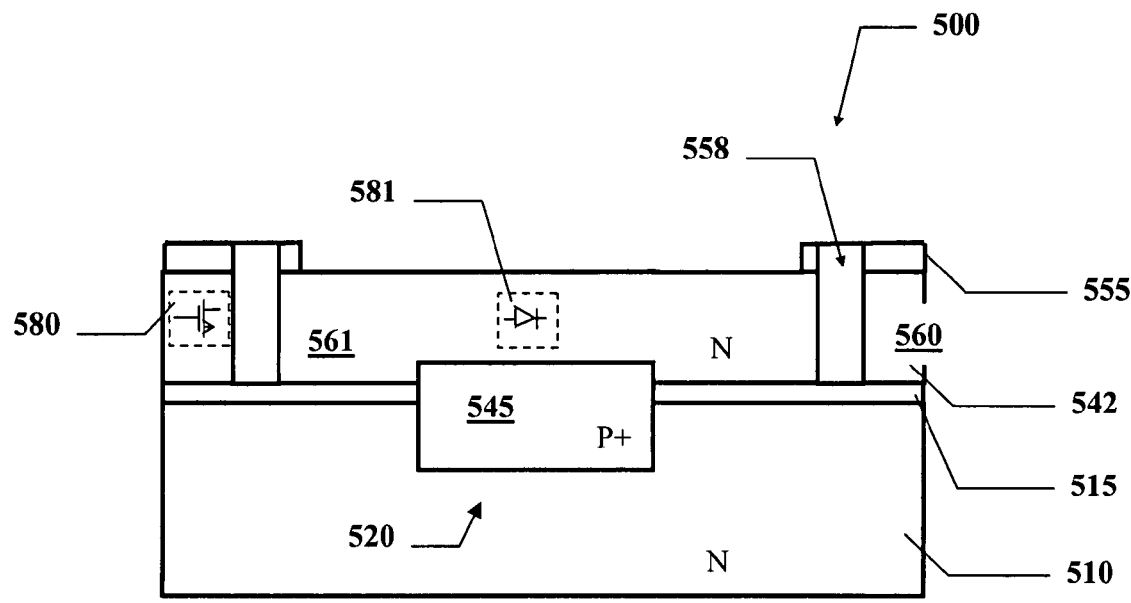

Continuing to FIG. 5F, one or more insulating trenches 558 are formed as described above reaching the insulating layer 515 (so as to obtain the desired electronic device 500). The insulating trenches 558 again partition the active layer 542 into multiple active regions 560, which are fully insulated by the insulating layer 515 and the insulating trenches 558. Moreover, the insulating trench 558 shown in the figure—around the contact trench 520—defines a further active region 561; the active region 561 is insulated from the substrate 510 by means of the PN junctions formed by the insulating region 545 (when reverse-biased).

The active regions 560 are typically used to integrate high-voltage electronic components or devices that need fast access time, low leakage and low parasitic capacitance (schematically represented in the figure as 580), so as to benefit from the typical advantages of the SOI structures. At the same time, the active region 561 is typically used to integrate low-voltage electronic components or devices that have to dissipate heat through the semiconductor substrate (schematically represented in the figure as 581), which instead would be adversely affected by the SOI structure. As a result, it is possible to obtain a selective structure, which is well suited to house both low-voltage and high-voltage electronic components.

Naturally, in order to satisfy local and specific requirements, a person skilled in the art may apply to the solution described above many modifications and alterations. Particularly, although the present invention has been described with a certain degree of particularity with reference to preferred embodiments thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations apply if the device has an equivalent structure (such as with layers having different thickness); moreover, although in the preceding description reference has been made to a semiconductor substrate and a starting layer of N-type, the conductivity type of these layers may be reversed (i.e., of P-type).

It is emphasized that the described process is not to be interpreted in a limitative manner; particularly, it is possible to use equivalent steps, to remove some steps being not essential, or to add further optional steps.

Moreover, the starting material may be either a SOI wafer already ready to be processed or a structure formed by conventional manufacturing processes.

In any case, the implantation processes after the epitaxial growing process are not strictly necessary and they may be omitted in a simplified implementation (even if the performance of the resulting structure would be reduced).

In any case, different beams of dopant ions can be used during the implantation processes (even with a different number of them, down to a single one).

Moreover, nothing prevents using beams, which form a different angle with the axis of each contact trench (down to zero).

Alternatively, it is also possible to form the contact windows at a different angle with respect to the axis of each contact trench; however, nothing prevents having some contact window along the axis of a corresponding contact trench.

It should be noted that although in the preceding description reference has been made to a specific number of contact trenches (for the front-rear contact and the gettering region), this is not to be intended in a limitative manner; however nothing prevents forming a single contact trench even in these embodiments of the invention.

Moreover, alternative layouts are feasible (for example, with different shapes and/or sizes of the contact trenches, or other arrangements thereof.

Conversely, the use of more contact trenches is contemplated even in the embodiment of the invention relating to the selective SOI structure.

Without departing from the principles of the invention, it is of course possible to form more active regions (for the front-rear-contact), more gettering regions and/or more active regions based on the PN-junction isolation—by means of corresponding insulating trenches.

It should be readily apparent that the proposed structures may be part of the design of integrated circuits. The design may also be created in a programming language; moreover, if the designer does not fabricate chips or masks, the design may be transmitted by physical means to others. In any case, the resulting integrated circuits may be distributed by their manufacturer in raw wafer form, as bare dies, or in packages form. Moreover, the devices may be integrated with other circuits in the same chip, or they may be mounted in intermediate products (such as mother boards). In any case, the integrated circuits are suitable to be used in complex systems (such as computers).

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An integrated electronic device of the SOI type comprising:
    a semiconductor substrate,
    an insulating layer on the semiconductor substrate,
    a semiconductor active layer on the insulating layer,
    components of the device integrated in the active layer,
    at least one contact trench crossing the insulating layer, the at least one contact trench being at least partially filled with semiconductor material;
    a contact region enclosing the at least one contact trench, the contact region having the same type of conductivity as and a concentration of impurities higher than the semiconductor substrate and the active layer,
    an insulating trench extending from an exposed surface of the active layer to the insulating layer around the at least one contact trench, the insulating trench insulating an active region of the active layer from a remaining portion thereof, the components being integrated in the remaining portion of the active layer,
    a further contact region in the active region extending from the exposed surface of the active layer to the contact region, the further contact region having the same type of conductivity as and a concentration of impurities higher than the active layer, and
    an electrical contact on a contact window of an exposed surface of the further contact region, the electrical contact contacting the semiconductor substrate through the at least one contact trench.

2. The device according to claim 1, wherein each point of the contact window is spaced apart from an axis of each contact trench.

3. The device according to claim 2, wherein a line, between each point of the contact window and an edge of each contact trench closest to the contact window at an interface between the insulating layer and the semiconductor substrate, forms an angle with the axis of the contact trench higher than 60°.

4. The device according to claim 1, wherein the at least one contact trench comprises a plurality of contact trenches.

5. The device according to claim 4, wherein each pair of adjacent contact trenches is spaced apart by a distance ranging from 1μm to 3μm, and wherein each contact trench has a square transversal section with each side thereof ranging from 1.5μm to 5μm.

6. An integrated electronic device of the SOI type comprising:
    a semiconductor substrate,
    an insulating layer on the semiconductor substrate,
    a semiconductor active layer on the insulating layer,
    components of the device integrated in the active layer,
    at least one contact trench crossing the insulating layer, the at least one contact trench being at least partially filled with semiconductor material;
    a contact region enclosing the at least one contact trench, the contact region having the same type of conductivity as and a concentration of impurities higher than the semiconductor substrate and the active layer, the contact region gettering impurities of the active layer, and
    an insulating trench extending from an exposed surface of the active layer to the insulating layer around the at least one contact trench, wherein the insulating trench insulates a gettering region of the active layer segregating the gettered impurities from a remaining portion of the active layer, the components being integrated in the remaining portion of the active layer.

7. An integrated electronic device of the SOI type comprising:
- a semiconductor substrate,
- an insulating layer on the semiconductor substrate,
- a semiconductor active layer on the insulating layer,
- components of the device integrated in the active layer,
- at least one contact trench crossing the insulating layer, the at least one contact trench being at least partially filled with semiconductor material;
- an insulating region enclosing the at least one contact trench, the insulating region having a type of the conductivity different than a type of conductivity of the semiconductor substrate and of the active layer, and
- an insulating trench extending from an exposed surface of the active layer to the insulating layer around the at least one contact trench, the insulating trench insulating a first active region of the active layer from a remaining second region thereof, wherein first components are integrated in the first active region, the first components being insulated from the semiconductor substrate by a junction formed by the insulating region with the active layer and/or the semiconductor substrate when reverse-biased, and wherein second components are integrated in the second active region, the second components being insulated from the semiconductor substrate by the insulating layer.

* * * * *

UNITED STATES PATENT AND TRADEMARK OFFICE
CERTIFICATE OF CORRECTION

PATENT NO. : 7,635,896 B2 Page 1 of 1
APPLICATION NO. : 11/820393
DATED : December 22, 2009
INVENTOR(S) : Pietro Montanini et al.

It is certified that error appears in the above-identified patent and that said Letters Patent is hereby corrected as shown below:

On the title page, item (75) should read:
(75) Inventors: Pietro Montanini; Milan (IT), Giuseppe Ammendola, S. Giuseppe Vesuviano (IT), Riccardo Depetro, Domodossola (IT), Marta Mottura, Milan (IT)

Signed and Sealed this

Second Day of February, 2010

David J. Kappos
*Director of the United States Patent and Trademark Office*